(12) United States Patent
Walser et al.

(10) Patent No.: US 8,872,506 B2
(45) Date of Patent: Oct. 28, 2014

(54) MOUNTING SYSTEMS FOR USE WITH METERS AND METHOD OF ASSEMBLING SAME

(75) Inventors: Michael Sven Walser, Widnau (CH); Steven Lee Bietz, Atlanta, GA (US)

(73) Assignee: General Electric Company, Schenectady, NY (US)

( * ) Notice: Subject to any disclaimer, the term of this patent is extended or adjusted under 35 U.S.C. 154(b) by 266 days.

(21) Appl. No.: 13/253,199

(22) Filed: Oct. 5, 2011

(65) Prior Publication Data
US 2013/0088214 A1   Apr. 11, 2013

(51) Int. Cl.
*G01R 1/04* (2006.01)
*G01R 11/04* (2006.01)
*G01R 11/24* (2006.01)

(52) U.S. Cl.
CPC ............... *G01R 11/04* (2013.01); *G01R 11/24* (2013.01)
USPC ...................................... 324/156; 292/307 B

(58) Field of Classification Search
USPC ........................................................ 324/156
See application file for complete search history.

(56) References Cited

U.S. PATENT DOCUMENTS

| | | | | |
|---|---|---|---|---|
| 2,820,660 A * | 1/1958 | Ainsworth | ................... | 292/327 |
| 3,786,389 A * | 1/1974 | Kondo | ......................... | 337/389 |
| 4,121,147 A * | 10/1978 | Becker et al. | ................. | 324/104 |
| 4,146,258 A | 3/1979 | Andruchiw | | |
| 4,621,230 A * | 11/1986 | Crouch et al. | ................. | 324/110 |
| 5,851,038 A * | 12/1998 | Robinson et al. | ......... | 292/256.67 |
| 5,861,742 A * | 1/1999 | Miller et al. | ................... | 324/156 |
| 6,308,997 B1 * | 10/2001 | Haseley et al. | ........... | 292/307 R |
| 6,316,932 B1 | 11/2001 | Horan et al. | | |
| 6,371,539 B1 | 4/2002 | Olshausen | | |
| 6,605,937 B2 | 8/2003 | Germer et al. | | |
| 6,764,114 B1 | 7/2004 | Guillon | | |
| 6,940,711 B2 * | 9/2005 | Heuell et al. | ................... | 361/668 |
| 7,265,532 B2 | 9/2007 | Karanam et al. | | |
| 7,821,776 B2 | 10/2010 | Loy et al. | | |
| 2002/0074990 A1 | 6/2002 | Shincovich | | |
| 2002/0135355 A1 * | 9/2002 | Acacio | .......................... | 324/156 |
| 2007/0103334 A1 | 5/2007 | Soni | | |
| 2009/0284251 A1 | 11/2009 | Makinson et al. | | |

* cited by examiner

*Primary Examiner* — Huy Q Phan
*Assistant Examiner* — Dustin Dickinson
(74) *Attorney, Agent, or Firm* — Armstrong Teasdale LLP

(57) ABSTRACT

An electricity meter is provided. The electricity meter includes a body and a cover including at least one mount for coupling the cover to the body. The at least one mount includes a receiving portion on an exterior surface of the cover and having an aperture extending therethrough, the receiving portion including a top, a bottom, and at least one cutout extending from the top towards the bottom.

16 Claims, 5 Drawing Sheets

MOUNTING SYSTEMS FOR USE WITH METERS AND METHOD OF ASSEMBLING SAME

BACKGROUND OF THE INVENTION

The present application relates generally to metered power systems and, more particularly, to mounts for electricity meters.

Power generated by an electric utility is typically delivered to a customer via an electric grid. At least some known power generation and delivery systems include a plurality of electricity meters that measure and collect information relevant to energy usage. Such meters may be accessed by electric utility operators to determine energy usage at a particular location. In some instances, the information may be collected without an operator actually accessing the physical meter. To prevent unauthorized individuals from tampering with the meters, at least some known meters include a meter seal, such as a loop of wire or a metal pin, threaded through a fastening device. The fastening device engages a feature on the meter such that when an unauthorized individual manipulates the fastening device to access the meter, the meter seal is damaged and/or part of the meter itself is deformed, and an operator can determine that the meter has been tampered with.

In at least some known meters, the feature includes a set of holes that align with an aperture formed in the fastening device. The feature and holes are generally formed using an injection molding process. However, given the orientation and arrangement of the holes on the feature, the molding process typically requires the use of molds including complicated mechanisms such as moveable pins, sliders, and/or lifters. Such molds increase the complexity, time, and cost of the manufacturing processes. Moreover, such molds limit the number of relative locations where the feature can be formed.

BRIEF DESCRIPTION OF THE INVENTION

In one aspect, an electricity meter is provided. The electricity meter includes a body and a cover including at least one mount for coupling the cover to the body. The at least one mount includes a receiving portion on an exterior surface of the cover and having an aperture extending therethrough, the receiving portion including a top, a bottom, and at least one cutout extending from the top towards the bottom.

In another aspect, a mounting assembly for use with an electricity meter cover is provided. The mounting assembly includes a receiving portion on a surface and having an aperture extending therethrough, the receiving portion including a top, a bottom, and at least one cutout extending from the top towards the bottom. The mounting assembly further includes a fastener configured to insert into the aperture, an opening extending through the fastener.

In yet another aspect, a method for assembling an electricity meter seal feature is provided. The method includes providing a meter cover that includes a receiving portion on an exterior surface of the cover and having an aperture extending therethrough, the receiving portion including a top, a bottom, and at least one cutout extending from the top towards the bottom. The method further includes inserting a fastener into the aperture such that an opening extending through the fastener substantially aligns with the at least one cutout, and inserting a portion of a meter seal through the fastener opening.

DETAILED DESCRIPTION OF THE INVENTION

The systems and methods described herein enable the relatively inexpensive and efficient manufacturing of a mount for use with, for example, an electricity meter. The mount includes a receiving portion including at least one cutout. A fastener, such as a screw, is inserted into the receiving portion and tightened until an aperture defined in the fastening device is substantially aligned with the cutouts. The mount also includes a slot that is aligned with one of the cutouts to provide access to the cutout and to the fastener aperture. The receiving portion and slot can be formed using a single projection of a mold during an injection molding process.

Figure 1:
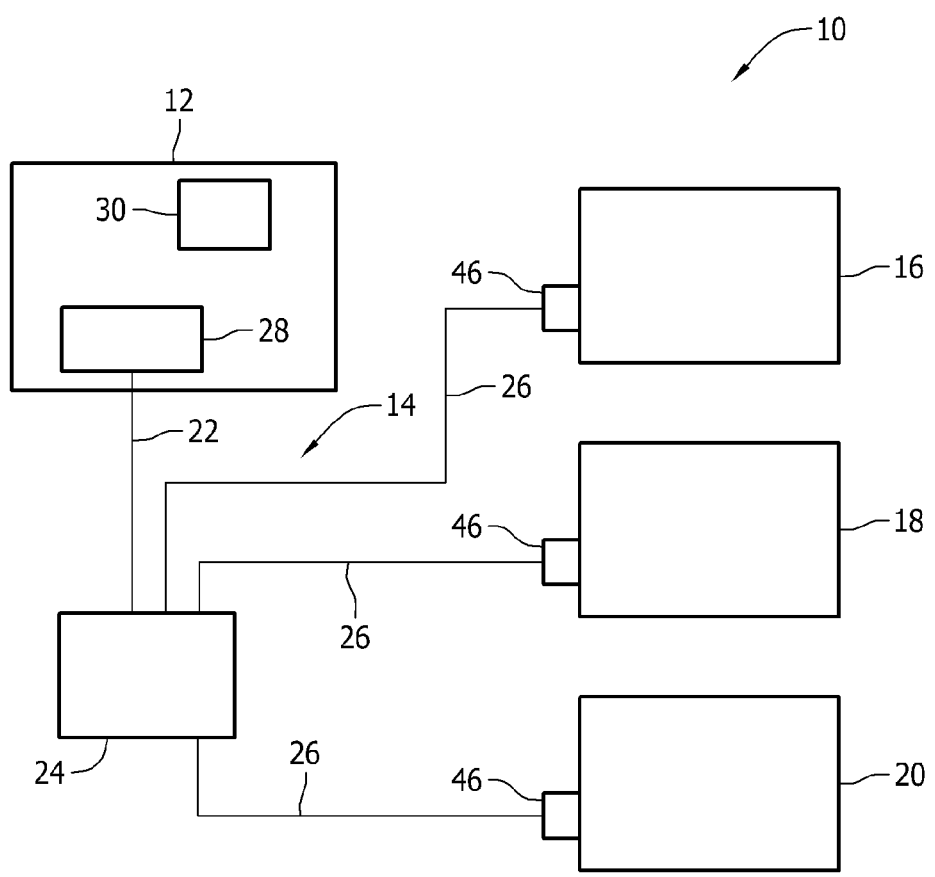
FIG. 1 is a block diagram of an exemplary power generation and delivery system.

FIG. 1 is a block diagram of an exemplary power generation and delivery system 10. In the exemplary embodiment, power generation and delivery system 10 includes an electric utility 12, an electrical grid 14, and a plurality of customer or energy user locations, such as, a first customer location 16, a second customer location 18, and a third customer location 20. Customer locations 16, 18, and 20 may include, but are not limited to only including, a residence, an office building, an industrial facility, and/or any other building or location that receives energy from the electric utility 12. Although described herein as including three locations, power generation and delivery system 10 may include any suitable number of locations that allows power generation and delivery system 10 to function as described herein.

In the exemplary embodiment, electricity is delivered from electric utility 12 to customer locations 16, 18, and 20 via electrical grid 14. In the exemplary embodiment, electrical grid 14 includes at least one transmission line 22, an electrical substation 24, and a plurality of distribution lines 26. Moreover, in the exemplary embodiment, electric utility 12 includes an electric power generation system 28 that supplies electrical power to electrical grid 14. Electric power generation system 28 may include a generator (not shown) driven by, for example, a gas turbine engine, a hydroelectric turbine, and/or a wind turbine (none shown). Alternatively, electric power generation system 28 may utilize solar panels (not shown) and/or any other electricity generating device that enables system 10 to function as described herein.

In the exemplary embodiment, electric utility 12 also includes a distribution control center substation 30 that controls energy production and delivery. Distribution control center substation 30 is illustrated as being included within electric utility 12, but alternatively, distribution control center substation 30 may be external to electric utility 12 (e.g., remotely located) and in communication with electric utility 12. Furthermore, although described as including a computer system (not shown), distribution control center substation 30 may include any suitable processing device that enables power generation and delivery system 10 to function as described herein. The term processing device, as used herein, refers to central processing units, microprocessors, microcontrollers, reduced instruction set circuits (RISC), application specific integrated circuits (ASIC), logic circuits, and any other circuit or processor capable of executing the functions described herein.

In the exemplary embodiment, customer locations 16, 18, and 20 each include an end user meter 46. In the exemplary embodiment, end user meters 46 are part of an advanced metering infrastructure (AMI). The AMI is an example of a bi-directional communication system that enables electric utility 12 to measure and collect information relevant to energy usage from customer locations 16, 18, and 20, as well as to provide data and control signals to end user meter 46. Information may also be collected from other subsystems of electric power generation and delivery system 10.

Figure 2:
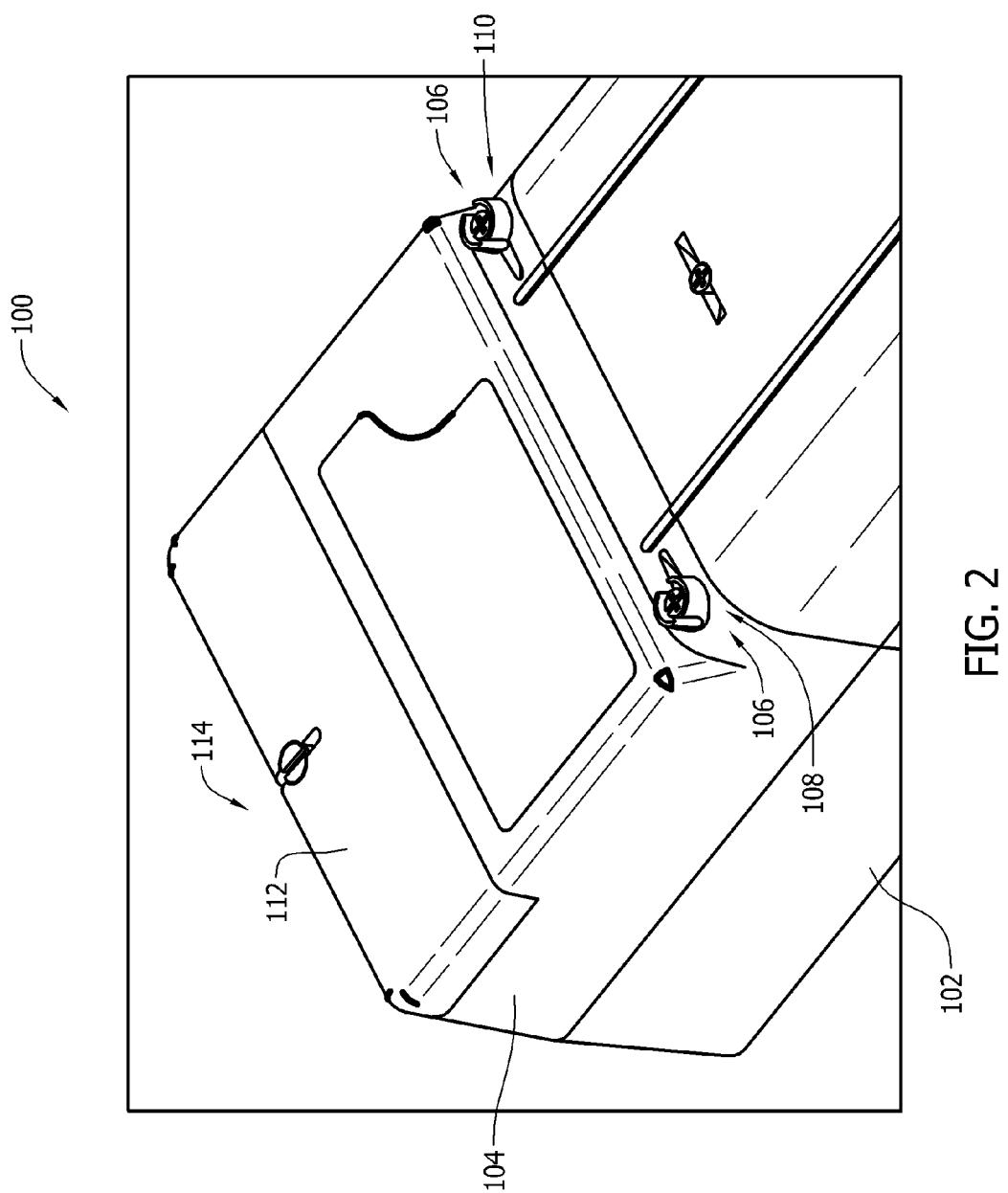
FIG. 2 is a partial perspective view of an exemplary electricity meter that may be used with the system shown in FIG. 1.

FIG. 2 is a partial perspective view of an exemplary electricity meter 100, such as end user meter 46 (shown in FIG. 1). Electricity meter 100 includes a meter body 102 and a cover 104. When removed, cover 104 enables access to electronics housed within electricity meter 100. For example, a utility company operator may remove cover 104 to repair, adjust, and/or maintain electronics housed inside electricity meter 100.

Cover 104 is coupled to body 102 at a plurality of mounts 106. As used herein, a "mount" refers to any sealing feature that facilitates coupling and/or sealing cover 104 to body 102, including, for example, protuberances, projections, and/or recessed features. In the exemplary embodiment, cover 104 includes a first mount 108 and a second mount 110. Alternatively, cover 104 may include any number of mounts 106 that enable cover 104 to be securely coupled to body 102. A top cover 112 is coupled to cover 104 at a top cover mount 114. Top cover 112 may include an advanced metering infrastructure (AMI) cover, a moveable cover button, and/or any other component configured to be coupled to cover 104 and/or body 102 using top cover mount 114.

Figure 3:
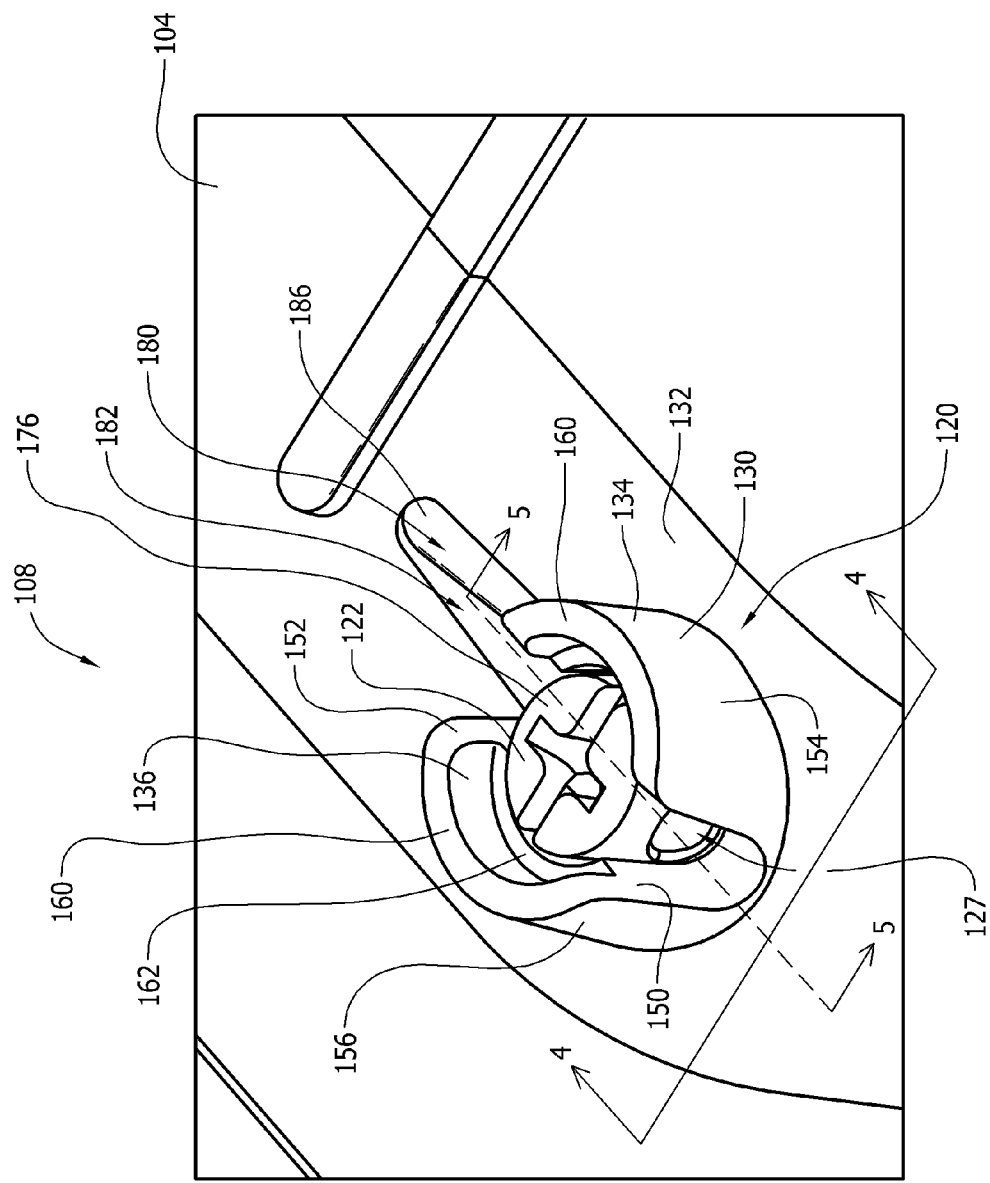
FIG. 3 is a perspective view of an exemplary mount extending from the electricity meter shown in FIG. 2.
Figure 4:
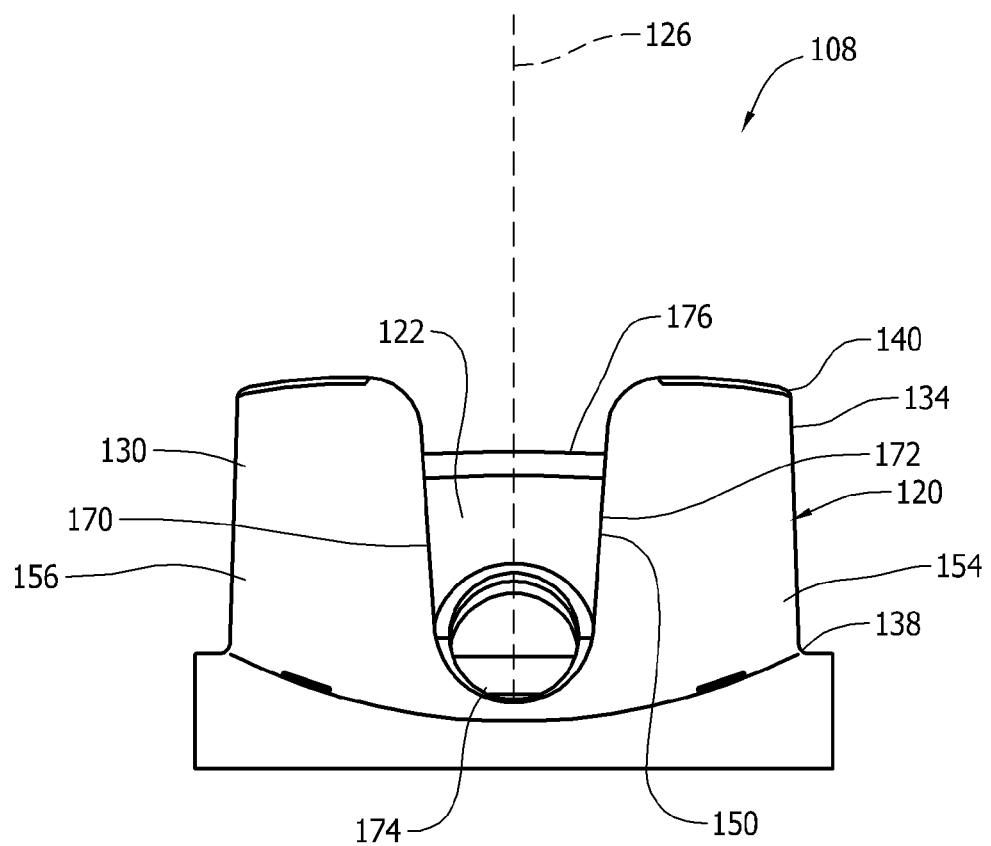
FIG. 4 is a side view of the mount shown in FIG. 3 and viewed from line 4-4.
Figure 5:
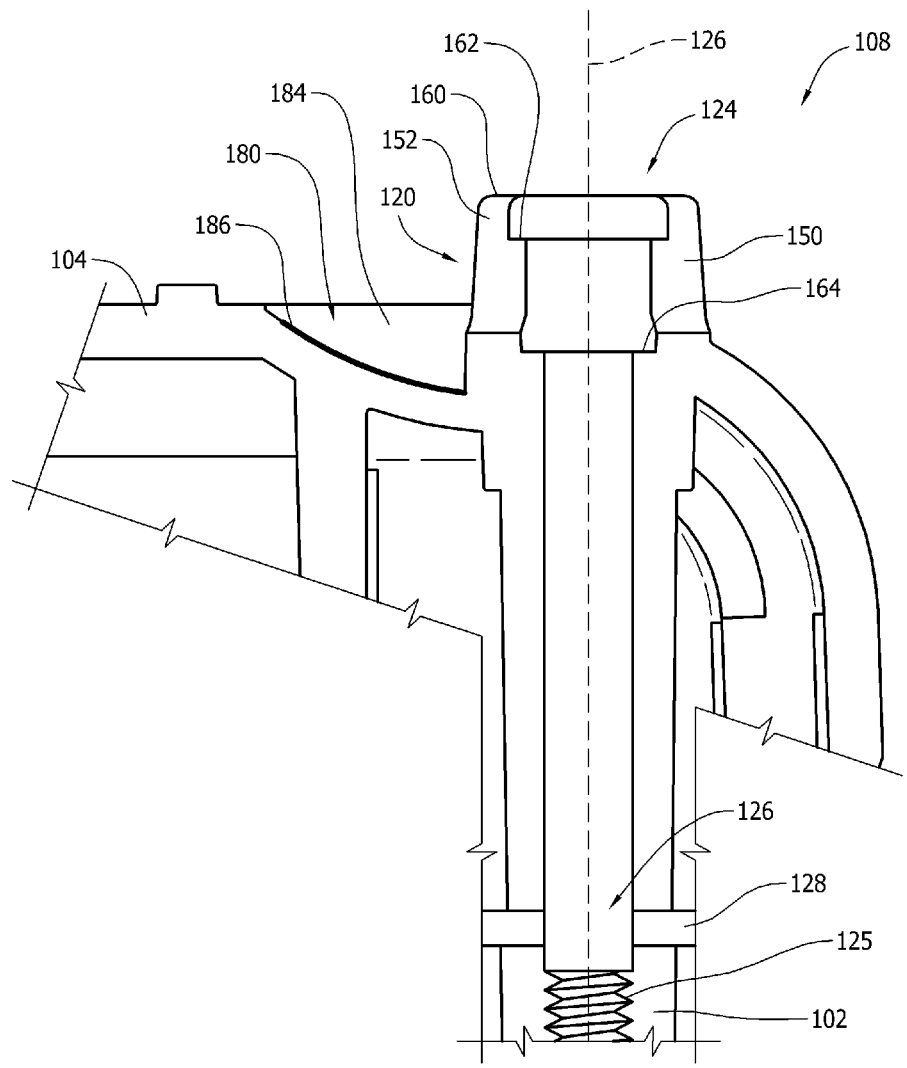
FIG. 5 is a partial cross-sectional view of the mount shown in FIG. 3 and taken along line 5-5.

FIG. 3 is a perspective view of first mount 108. FIG. 4 is a side view of first mount 108 viewed from line 4-4. FIG. 5 is a partial cross-sectional view of first mount 108 taken along line 5-5. In the exemplary embodiment, second mount 110 is substantially identical to first mount 108. First mount 108 includes a mounting feature 120 that is sized and oriented to receive a fastener 122, such as a screw. To couple cover 104 to body 102, fastener 122 is inserted into an aperture 124 defined in mounting feature 120 that extends through cover 104. Fastener 122 includes threads (not shown) for use in engaging a threaded surface 125 of body 102. While in the exemplary embodiment, fastener 122 is a threaded screw, alternatively, fastener 122 is any fastening device that enables mounting feature 120 to function as described herein.

A longitudinal axis 126 extends through aperture 124. A component of a known meter seal (not shown), for example, a wire or metal pin, can be threaded though an aperture 127 defined in fastener 122. While in the exemplary embodiment, fastener 122 is used to couple cover 104 to body 102, alternatively, any other suitable fastening device, threaded or non-threaded, may be used to couple cover 104 to body 102 that enables first mount 108 to function as described herein. In the exemplary embodiment, a sealing tab 128 is provided between cover 104 and body 102 along longitudinal axis 126. Sealing tab 128 includes a tab aperture 129 defined therethrough such that fastener extends through sealing tab 128 when cover 104 is coupled to body 102. Alternatively, meter 100 does not include sealing tab 128.

In the exemplary embodiment, mounting feature 120 includes a receiving portion 130 that extends from a surface 132 of cover 104. Alternatively, receiving portion 130 may be defined on surface 132 and/or recessed in surface 132. Aperture 124 extends through receiving portion 130. Receiving portion 130 includes a radially outer surface 134 and a radially inner surface 136. In the exemplary embodiment, receiving portion 130 is generally frusto-conical such that radially outer surface 134 tapers from a bottom 138 to a top 140 of receiving portion 130. Alternatively, receiving portion 130 may have any shape that enables mounting feature 120 to function as described herein, for example, substantially cylindrical.

A first cutout 150 and a second cutout 152, diametrically opposite from first cutout 150 about longitudinal axis 126, are each defined in receiving portion 130. First and second cutouts 150 and 152 extend from receiving portion top 140 towards bottom 138, and separate receiving portion 130 into a first portion 154 and a second portion 156 that is diametrically opposite first portion 154. Moreover, first and second portions 154 and 156 each include a top surface 160 and a first ledge 162 that are each substantially perpendicular to longitudinal axis 126. First ledge 162 extends below top surface 160 along longitudinal axis 126, and is radially inward from top surface 160. First ledge 162 provides greater access to fastener 122. Alternatively, receiving portion 130 does not include first ledge 162. In the exemplar embodiment, receiving portion includes a second ledge 164. When fastener 122 is used to attach cover 104 to body 102, a head of fastener 122 seats on second ledge 164.

In the exemplary embodiment, first and second cutouts 150 and 152 are defined by a first wall 170, an opposite second wall 172, and a substantially semi-circular portion 174 that extends between first and second walls 170 and 172. In the exemplary embodiment, first and second cutouts 150 and 152 have substantially the same cross-sectional shape (i.e., the same size and amount of material has been removed to form each cutout 150 and 152). Alternatively, first and second cutouts 150 may have any other shape and/or may have different shapes and/or orientations that enable mounting feature 120 to function as described herein.

When fastener 122 is inserted into aperture 124, a top 176 of fastener 122 is positioned adjacent ledge 162, fastener 122 is centered between first and second cutouts 150 and 152, and fastener aperture 127 is aligned with first and second cutouts 150 and 152. Accordingly, first and second cutouts 150 and 152 guide a component (e.g., a wire, metal pin, etc.) of a meter seal (not shown) into fastener aperture 127 and enable threading the component through fastener aperture 127 and guiding the component into fastener aperture 127. More specifically, in the exemplary embodiment, the meter seal component is threaded through fastener aperture 127 after fastener 122 is inserted within aperture 124.

With the meter seal component threaded through fastener aperture 127, to remove cover 104 from body 102, fastener 122 is rotated about longitudinal axis 126. Moreover, as fastener 122 is rotated, fastener aperture 127 is rotated away from first and second cutouts 150 and 152 towards first and second portions 154 and 156, causing the component extending through fastener aperture 127 to become damaged and/or deform mounting feature 120. Accordingly, if an unauthorized individual rotates fastener 122 to remove cover 104 from body 102 or removes the meter seal component, an operator can easily determine whether electricity meter 100 has been tampered with by determining whether the meter seal component and/or mounting feature 120 is intact and undamaged.

Mounting feature 120 also includes a slot 180 defined in cover surface 132. When fastener 122 is fully inserted in aperture 124, at least a portion of fastener aperture 127, at second cutout 152, is positioned below surface 132. Accordingly, slot 180 provides access to fastener aperture 127 at second cutout 152. More specifically, slot 180 facilitates guiding the meter seal component into second cutout 152 and fastener aperture 127. Slot 180 is defined by a first slot wall 182, a second slot wall 184, and a bottom wall 186. First and second slot walls 182 and 184 are substantially perpendicular to surface 132. In the exemplary embodiment, bottom wall 186 is arcuate and extends between first and second walls 182 and 184. Further, bottom wall 186 is sloped and/or tapered with respect to surface 132. Alternatively, bottom wall 186 may have any shape that enables mounting feature 120 to be formed as described herein.

In the exemplary embodiment, cover 104 and/or mounting feature 120 is formed using an injection molding process in which a thermoplastic resin is injected into a mold cavity defined in a mold (neither shown). The mold is cooled to form cover 104 and/or mounting feature 120. In the exemplary embodiment, the mold also includes one or more projections (not shown) that form features, such as mounting feature 120. Alternatively, cover 104 and/or mounting feature 120 may be formed by any methods that enable cover 104 and mounting feature 120 to function as described herein. For example, cover 104 and/or mounting feature 120 may be formed from a thermoset or stamped steel.

Notably, the entire mounting feature 120 may be formed from a single, static projection in the mold. That is, in the exemplary embodiment, a single projection extending from the mold forms receiving portion 130 and slot 180. Because receiving portion 130 includes cutouts 150 and 152, rather than holes, no moving mold components, such as pins, sliders, and/or lifters, are required to form mounting feature 120. In contrast, at least some known meter seal features include holes that must be aligned with a fastener aperture rather than cutouts 150 and 152. Unlike cutouts 150 and 152, forming such holes typically requires complicated manufacturing mechanisms such as moveable pins, sliders, and/or lifters to form the holes during the injection molding process.

As compared to at least some known meter features formed using injection molding processes, the mounting feature described herein can be formed using a single projection of a mold. Accordingly, unlike at least some known meter features, moveable pins, sliders, and/or lifters are not required to form the mounting feature described herein. As relatively complicated molds are not required, the manufacturing process may be quicker, more efficient, and more inexpensive than the manufacturing process of at least some known meter features. For example, the systems and methods described herein may facilitate increasing the number of cavities that may be used in a multi-cavity production process while decreasing the cost to manufacture each cavity.

The embodiments described herein enable the relatively inexpensive and efficient manufacturing of a mount used, for example, an electricity meter. The mount includes a receiving portion including at least one cutout. A fastener, such as a screw, is inserted into the receiving portion and tightened until an aperture extending through the fastener is generally aligned with the cutouts. The mounting feature also includes a slot that is aligned with one of the cutouts, thus providing access to the cutout and to the fastener aperture. The receiving portion and slot can be formed using a single projection of a mold during an injection molding process.

The methods and systems described herein are not limited to the specific embodiments described herein, but rather, components of the systems and/or steps of the methods may be utilized independently and separately from other components and/or steps described herein. For example the mounting feature described herein is not limited to use with an electricity meter, but may be used in any number of parts and/or components that are formed using an injection molding process and other manufacturing processes.

Although specific features of various embodiments of the invention may be shown in some drawings and not in others, this is for convenience only. In accordance with the principles of the invention, any feature of a drawing may be referenced and/or claimed in combination with any feature of any other drawing.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal language of the claims.

What is claimed is:

1. An electricity meter comprising:
   a body; and
   a cover comprising an exterior surface and at least one mount for coupling said cover to said body, said at least one mount comprising:
      a receiving portion on said exterior surface of said cover and having an aperture extending therethrough, said receiving portion comprising:
         a top;
         a bottom; and
         at least one cutout extending from said top towards said bottom; and
      a slot defined in said exterior surface of said cover and extending into said at least one cutout, said slot defined by:
         a first wall;
         a second wall; and
         a bottom extending between said first and second walls, said bottom sloped with respect to said exterior surface.

2. An electricity meter in accordance with claim 1, wherein said receiving portion and said slot are sized and oriented such that said receiving portion and said slot are configured to be formed by a single projection of a mold.

3. An electricity meter in accordance with claim 1, wherein said aperture is sized and oriented to receive a fastener therein such that an opening defined through the fastener is substantially aligned with said at least one cutout.

4. An electricity meter in accordance with claim 1, wherein said at least one cutout comprises a first cutout and a second cutout that is diametrically opposite the first cutout.

5. An electricity meter in accordance with claim 1, wherein said receiving portion has a frusto-conical shape such that a radially outer portion of said receiving portion is tapered from said bottom to said top.

6. An electricity meter in accordance with claim 1, wherein said at least one cutout is defined by a first wall, an opposing second wall, and a substantially semi-circular portion extending between said first and second walls.

7. A mounting assembly for use with an electricity meter cover that includes an exterior surface, said assembly comprising:
   a receiving portion on the exterior surface and having an aperture extending therethrough, said receiving portion comprising:
      a top;

a bottom; and at least two cutouts, said two cutouts being diametrically opposite each other and each extending from said top towards said bottom and from a radially inner surface of said receiving portion to a radially outer surface of said receiving portion, wherein said receiving portion has a frusto-conical shape oriented such that a radially outer portion of said receiving portion tapers from said bottom to said top; and a fastener configured to insert into said aperture and comprising an opening extending therethrough.

8. A mounting assembly in accordance with claim 7, wherein said mounting assembly further comprises a slot defined in the exterior surface, said slot extending into said at least one cutout.

9. A mounting assembly in accordance with claim 8, wherein said receiving portion and said slot are sized and oriented such that said receiving portion and said slot are configured to be formed by a single projection of a mold.

10. A mounting assembly in accordance with claim 7, wherein said fastener is configured to insert into said aperture such that said fastener opening substantially aligns with said at least one cutout.

11. A mounting assembly in accordance with claim 7, wherein said at least one cutout is defined by a first wall, an opposing second wall, and a substantially semi-circular portion extending between said first and second walls.

12. A method for assembling an electricity meter seal feature, said method comprising:

providing a meter cover that includes a receiving portion on an exterior surface of the cover and having an aperture extending therethrough, the receiving portion including a top, a bottom, and at least two cutouts, said two cutouts being diametrically opposite each other and each extending from said top towards said bottom and from a radially inner surface of said receiving portion to a radially outer surface of said receiving portion, wherein the receiving portion has a frusto-conical shape oriented such that a radially outer portion of the receiving portion tapers from the bottom to the top;

inserting a fastener into the aperture such that an opening extending through the fastener substantially aligns with the at least one cutout; and inserting a portion of a meter seal through the fastener opening.

13. A method in accordance with claim 12, wherein providing a meter cover comprises providing a meter cover formed using an injection molding process.

14. A method in accordance with claim 12, further comprising coupling the meter cover to a meter body such that a sealing tab between the meter cover and the meter body is aligned with the aperture.

15. A method in accordance with claim 12, wherein inserting a portion of a meter seal through the fastener opening comprises inserting the portion through the fastener opening such that when the fastener is rotated with respect to the receiving portion, at least one of the receiving portion and the meter seal is damaged.

16. A method in accordance with claim 12, wherein providing a meter cover comprises providing a meter cover that further includes a slot defined in the exterior surface of the meter cover, the slot extending into the at least one cutout.

* * * * *